(12) United States Patent
Sakata

(10) Patent No.: US 7,713,863 B2
(45) Date of Patent: May 11, 2010

(54) METHOD FOR MANUFACTURING A SEMICONDUCTOR DEVICE AND METHOD FOR ETCHING THE SAME

(75) Inventor: Toyokazu Sakata, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/110,479

(22) Filed: Apr. 28, 2008

(65) Prior Publication Data

US 2008/0318409 A1 Dec. 25, 2008

Related U.S. Application Data

(62) Division of application No. 11/306,205, filed on Dec. 20, 2005, now abandoned.

(30) Foreign Application Priority Data

Dec. 20, 2004 (JP) ............................. 2004-368064

(51) Int. Cl.
*H01L 21/4763* (2006.01)
(52) U.S. Cl. .................... 438/623; 438/637; 438/638; 257/E21.585
(58) Field of Classification Search ............... 438/623, 438/637, 638; 257/E21.585
See application file for complete search history.

(56) References Cited

U.S. PATENT DOCUMENTS

| 6,372,631 B1 | 4/2002 | Wang et al. |
| 6,383,919 B1 * | 5/2002 | Wang et al. ................ 438/638 |
| 6,521,524 B1 | 2/2003 | Wang et al. |

FOREIGN PATENT DOCUMENTS

JP 2002124568 A 4/2002

\* cited by examiner

*Primary Examiner*—Jack Chen
(74) *Attorney, Agent, or Firm*—Volentine & Whitt, P.L.L.C.

(57) ABSTRACT

A method for manufacturing a dual damascene structure includes forming a wiring layer over a substrate, forming an inorganic insulating film over the wiring layer, forming a via hole in the inorganic insulating film using a first resist pattern with an opening as an etching mask, removing the first resist pattern, forming an organic insulating film on the inorganic insulating film and in the via hole, forming a hard mask on the organic insulating film, forming a hard mask pattern using a second resist pattern with an opening on the hard mask as an etching mask, forming a wiring groove by etching the organic insulating film using the second resist pattern and the hard mask pattern as etching masks until the organic insulating film inside the via hole is eliminated and simultaneously eliminating the second resist pattern, and implanting a conductive substance into the via hole and wiring groove.

10 Claims, 9 Drawing Sheets

METHOD FOR MANUFACTURING A SEMICONDUCTOR DEVICE AND METHOD FOR ETCHING THE SAME

CROSS-REFERENCE TO RELATED APPLICATIONS

This application is a divisional application of application Ser. No. 11/306,205, filed Dec. 20, 2005, which has been abandoned, and which is hereby incorporated for all purposes.

BACKGROUND OF THE INVENTION

1. Field of the Invention

The present invention relates to a method for manufacturing a semiconductor device and a method for etching the same.

2. Description of the Background Art

Recently, the performance and function of semiconductor devices has been advanced. For example, the operating frequency of microprocessors has entered a new "GHz band" era, and a system that mounts a plurality of circuits with different functions on one semiconductor chip, a so-called a system-on-chip (SOC), has entered the field. This semiconductor device employs a multilayer wiring structure in which wirings are formed in a plurality of layers in the thickness direction of the semiconductor device in order to improve its degree of integration. In particular, a multilayer wiring structure referred to as a dual damascene structure has been developed in these years. A dual damascene structure is a further advancement of the damascene structure. In the damascene structure, Cu is used as a wiring material because of its low-resistance and high-electromigration resistance properties, and wiring is implanted with the chemical mechanical polishing (CMP) method. On the other hand, in the dual damascene method, a wiring groove and a via hole are formed in the interlayer insulating film, and a conductive substance such as Cu is simultaneously implanted in the groove and the hole. Thus, an upper layer wiring and a via plug are formed at one time. Therefore, the manufacturing cost of a semiconductor device is reduced in the dual damascene method, compared to a normal damascene method, a so-called single damascene method, in which a wiring groove and a via hole are separately formed.

In a semiconductor device with a multilayer wiring structure, the operation speed of the semiconductor device is highly influenced by not only the resistance value of the wiring itself, but also by the inter-wiring capacitance formed by an interlayer insulating film that is formed in a place between a lower layer wiring and an upper layer wiring. Therefore, the resistance of the wiring itself and the inter-wiring capacitance have to be reduced in order to realize an increase in the operation speed of a semiconductor device. To reduce the inter-wiring capacitance, it is required to reduce the dielectric constant of an interlayer insulating film by using a low dielectric constant film, a so-called a low-k film, as an interlayer insulating film. Also, it is required to take the wiring structure into consideration from the perspective of reducing the effective dielectric constant (keff). In general, the dual damascene structure is classified roughly into two structures. One is the so-called homogeneous structure. This is a unitary structure in which the same type of low-k film is used as the insulating film for a wiring portion and for a via hole portion. The other is the so-called hybrid structure. This is a heterogeneous structure in which different types of low-k films are used as the insulating film for a wiring portion and for a via hole portion. In the homogeneous structure, the depth of the wiring grooves is controlled. Therefore, it is required to use a film with a high dielectric constant, such as a silicon nitride film (relative dielectric constant: k=7.0) and a silicon carbide film (k=4.5) as an etching stopper layer. Because of this, the homogeneous structure has a disadvantage in that the value of the effective dielectric constant (keff) becomes high. On the other hand, in the hybrid structure, it is easy to set the etch selectivity between substances of different low-k film to be higher. Therefore, it is not required to use an etching stopper layer with a high dielectric constant, such as silicon nitride film and silicon carbide film. Because of this, the hybrid structure has an advantage in that the effective dielectric constant (keff) of the whole wiring structure can be reduced, compared to the homogeneous structure.

Japanese Patent Publication JP-A-2002-124568 (especially pages 6-7 and FIG. 2) describes a method for manufacturing a semiconductor device with the hybrid type dual damascene structure. Generally, in manufacturing a dual damascene structure of a semiconductor device, the corners of a hard mask used for forming a wiring groove and a via hole tend to be eliminated and inclined from the perpendicular during the process of etching an interlayer insulating film. This state is called the facet of a hard mask. If a facet state is produced, the wiring size of the hard mask will be wider than the design value. In some cases, this causes a short circuit between a wiring and its adjacent wiring. Because of this, there is a possibility that reliability will be lowered and the yield will be negatively influenced. In a method for manufacturing a semiconductor device described in Japanese Patent Publication JP-A-2002-124568, a facet of a hard mask is prevented in the process of etching by forming at least a layer of a dummy film, which does not exist in the structure at the end of the process of forming a semiconductor device, on the hard mask.

As described above, in manufacturing a dual damascene structure, there is a problem in that a facet of a hard mask is produced in the process of etching an interlayer insulating film. If a facet of a hard mask is produced, acceleration of etching will begin in the portion where the facet is produced, and this will cause a retrograde phenomenon in the hard mask. This phenomenon makes it difficult to form wiring sized at the desired design value. Because of this, there is a possibility that reliability will be lowered and the yield will be negatively influenced.

In the method for manufacturing a semiconductor device described in Japanese Patent Publication JP-A-2002-124568, a protective hard mask is further formed on a hard mask that is required to form a wiring groove and a via hole. Therefore, the number of processes to manufacturing a semiconductor device and the cost thereof are increased in the method.

In view of the above, it will be apparent to those skilled in the art from this disclosure that there exists a need for an improved method for manufacturing a semiconductor device. This invention addresses this need in the art as well as other needs, which will become apparent to those skilled in the art from this disclosure.

SUMMARY OF THE INVENTION

It is therefore an object of the present invention is to resolve the above-described problems, and to provide a method for manufacturing a semiconductor device in which a facet or a retrograde of a hard mask is prevented.

In accordance with the present invention, a method for manufacturing a semiconductor device with a dual damascene structure comprises the steps of preparing a semiconductor substrate, forming a first wiring layer over said semiconductor substrate, forming an inorganic insulating film over said first wiring layer, forming a via hole in said inorganic insulating film by forming a first resist pattern with an opening on said inorganic insulating film and by etching said inorganic insulating film with said first resist pattern as an etching mask, eliminating said first resist pattern, forming an organic insulating film so that said organic insulting film covers an upper side of said inorganic insulating film and an interior of said via hole, forming a hard mask on said organic insulating film, forming a hard mask pattern by forming a second resist pattern with an opening on said hard mask and by etching said hard mask with said second resist pattern as an etching mask, forming a wiring groove by etching said organic insulating film with said second resist pattern and said hard mask pattern as etching masks until said organic insulating film inside said via hole is eliminated and simultaneously eliminating said second resist pattern, and implanting a conductive substance into said via hole and said wiring groove.

According to the method for manufacturing a semiconductor device of the present invention, before an organic insulating film, which becomes an inter-wiring insulating film, is formed, a via hole is formed by etching an inorganic insulating film, which becomes an inter-via layer insulating film. Therefore, a hard mask is not needed for patterning a via hole, and the number of times a hard mask is exposed to the etching gas can be reduced. Thus, a facet and a retrograde of a hard mask can be inhibited, and the wiring can be sized at a desired design value. Therefore, reliability and yield can be improved.

These and other objects, features, aspects, and advantages of the present invention will become apparent to those skilled in the art from the following detailed description which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1A:
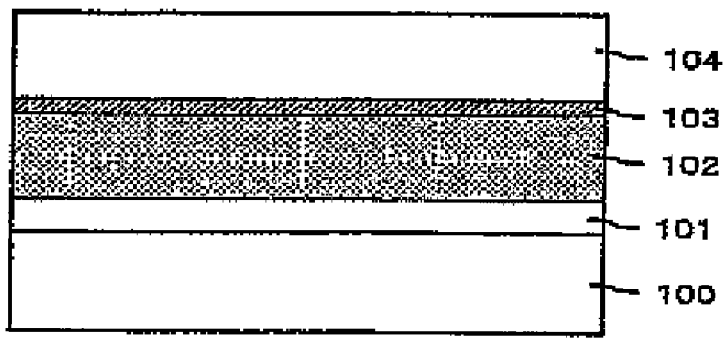
FIGS. 1A through 1H are views of diagrams showing a process of manufacturing a semiconductor device in accordance with a first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

FIGS. 1A though 1H are cross-section diagrams to explain a method for manufacturing a semiconductor device with a dual damascene structure in accordance with the first embodiment of the present invention.

First, as shown in FIG. 1A, a semiconductor substrate 100 is prepared. The semiconductor substrate 100 has an electronic circuit (not shown in the diagram) formed by a semiconductor element such as a transistor on its main surface. Then, an insulating film 101 is formed on the semiconductor substrate 100, and a lower layer wiring 102, which is made of Cu, is formed on the insulating film 101. Next, a diffusion barrier film 103 is formed on the lower layer wiring 102. For example, the diffusion barrier film 103 is made of a silicon nitride film and its thickness is set to be 500 Å. The diffusion barrier film 103 protects diffusion of Cu, which is the material of the lower layer wiring 102, and functions as an etching stopper layer with respect to the lower layer wiring 102. Also, the diffusion barrier film 103 is not necessarily required in the method of manufacturing a semiconductor device in accordance with the first embodiment of the present invention. For example, the diffusion barrier film 103 does hot have to be formed, if the etch selectivity between the lower layer wiring 102 and an inorganic insulating film 104 (i.e., an object of an etching) can be set to be a larger value in the process of forming a via hole 106 by etching in the process shown below in FIG. 1C. Next, the inorganic insulating film 104 is formed. The inorganic insulating film 104 becomes a inter-via layer insulating film in which a via hole 106 is formed in a process shown below in FIG. 1C. For example, the inorganic insulating film 104 is made of methyl-silsequioxane (MSQ) and its thickness is set to be 3000 Å. For example, a MSQ film can be formed with a method of spin-coating an MSQ substance and hardening it with a heat treatment in an inert gas atmosphere such as $N_2$. The MSQ film is a type of inorganic low-k film, and its relative, dielectric constant (k) is low (k=2.7~2.9). Therefore, the inter-wiring capacitance can be reduced by using the MSQ film as the inorganic insulating film 104. Also, a hydrogen-silsequioxane (HSQ) film can be used as a substance of the inorganic insulating film 104, instead of the MSQ film.

Figure 1B:
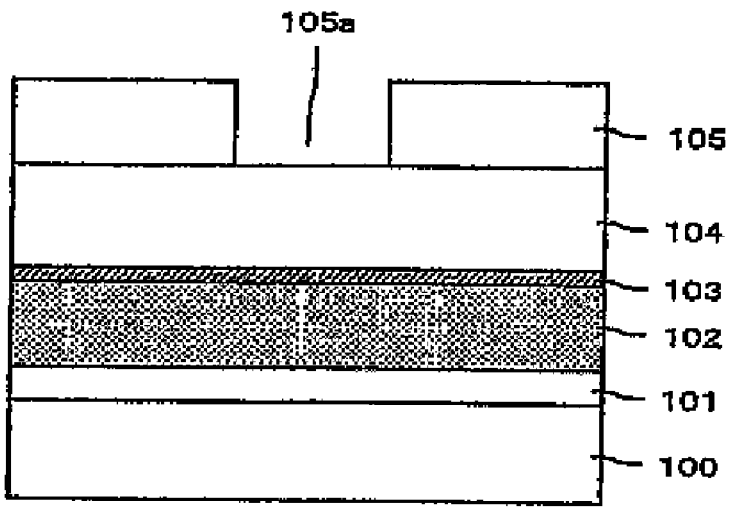

Next, as shown in FIG. 1B, a resist is applied on the inorganic insulating film 104 and a resist pattern 105 with an opening 105a is formed by photolithoetching the resist. For example, the diameter of the opening 105a is set to be 0.12 μm.

Figure 1C:
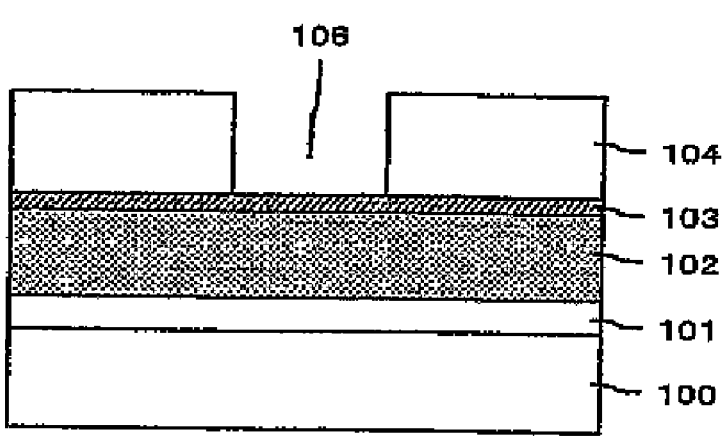

Next, as shown in FIG. 1C, a via hole 106 is formed by etching the inorganic insulating film 104 with the resist pattern 105 as an etching mask. The diameter of the via hole 106 is as large as that of the opening 105a, and it is set to be 0.12 μm, for instance. For example, in etching the inorganic insulating film 104, octafluocyclobutane ($C_4F_8$), oxygen ($O_2$), and argon (Ar) are used as the etching gas. The etching conditions are set as follows. That is, the gas flow rate (sccm) of $C_4F_8$, $O_2$, and Ar are set to be 20, 10 and 500 respectively, and the RF Power is set to be 1.5 kW, and the chamber pressure is set to be 40 mTorr. In the process of etching the inorganic insulating film 104 to form the via hole 106, the diffusion barrier film 103 functions as an etching stopper layer toward the lower layer wiring 102. Therefore, the lower layer wiring 102 is not etched. Next, the resist pattern 105 is eliminated with ashing.

Figure 1D:
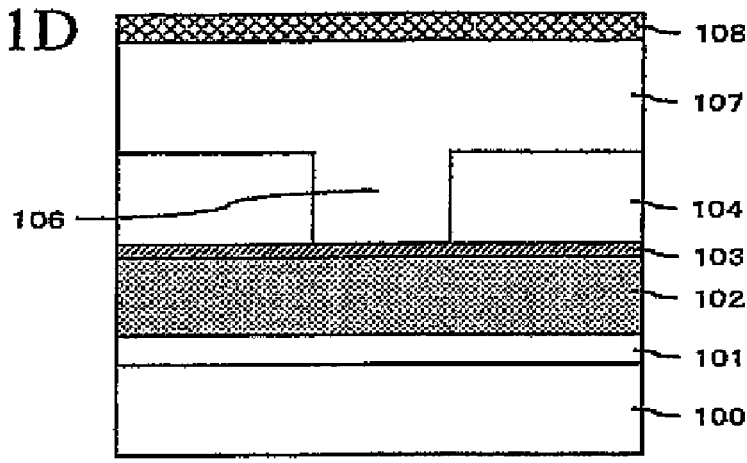

Next, as shown in FIG. 1D, an organic insulating film 107 is formed so that it covers the inorganic insulating film 104 and the inside of the via hole 106. The organic insulating film 107 becomes an inter-wiring layer insulating film in which a wiring groove is formed in a process shown below in FIG. 1F. For example, the organic insulating film 107 is made of silicon low-k polymer (SiLK™ of Dow Chemical Company), and its thickness is set to be 3000 Å. The silicon low-k polymer film can be formed by spin-coating the silicon low-k polymer substance and hardening it with a heat treatment in an inert gas atmosphere, such as $N_2$, for instance. The silicon low-k polymer film is a type of organic low-k film, and its relative dielectric constant is low (k=2.6-2.8). Therefore, the inter-wiring capacitance can be reduced by using the silicon low-k polymer as the organic insulating film 107. Also, GX-3™ of Honeywell International Inc. can be used as the material of the organic insulating film 107, instead of using SiLK™. Next, a silicon dioxide film, which becomes a hard mask 108, is formed with the chemical vapor deposition (CVD) method. Here, the thickness of the hard mask 108 is set so that its designated thickness can remain even after the diffusion barrier film 103 is eliminated with an etching in a process shown below in FIG. 1G.

Figure 1E:
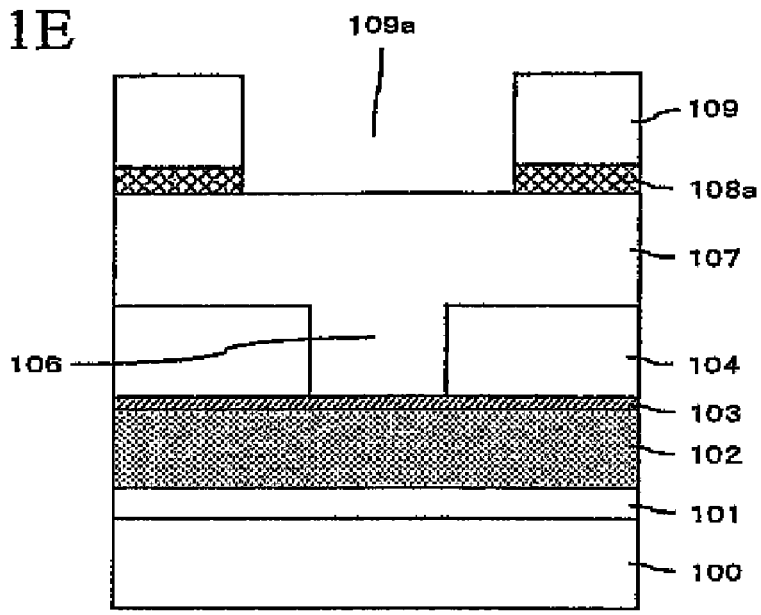

Next, a resist is applied on the hard mask 108, and a resist pattern 109 with an opening 109a is formed with photolitho-etching, as shown in FIG. 1E. Next, a hard mask 108a is formed by etching a silicon dioxide film (the hard mask 108) with the resist pattern 109 as an etching mask. For example, in etching the hard mask 108, octafluocyclobutane ($C_4F_8$), oxygen ($O_2$), and argon (Ar) are used as the etching gas. The etching conditions are set as follows. That is, the gas flow rate (sccm) of $C_4F_8$, $O_2$, and Ar are set to be 20, 10, and 500 respectively, and the RF Power is set to be 1.5 kW, and the chamber pressure is set to be 40 mTorr.

Figure 1F:
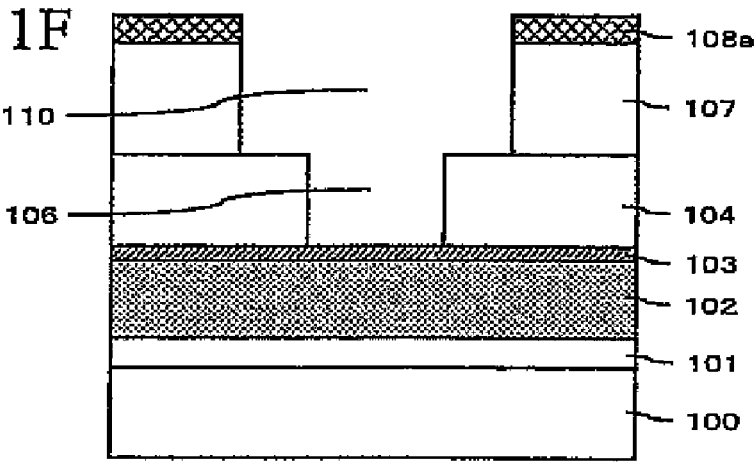

Next, as shown in FIG. 1F, a wiring groove 110 is formed by etching the organic insulating film 107 with the resist pattern 109 and the hard mask pattern 108a as etching masks. Also, a via hole 106 is exposed by eliminating the organic insulating film 107 that is implanted in the via hole 106. For example, in etching the organic insulating film 107, ammonia ($NH_3$) is used as the etching gas. The etching conditions are set as follows. That is, the gas flow rate of $NH_3$ is set to be 100 sccm, and the RF Power is set to be 500 W, and the chamber pressure is set to be 60 mTorr. Also, in this etching process, the resist pattern 109 can also be eliminated simultaneously. This is because the resist pattern 109 and the organic insulating film 107 (the SiLK™ film) are made of an organic substance. Because of this, an ashing treatment to eliminate the resist pattern 109 is not required. Therefore, the number of processes required for the method for manufacturing a semiconductor device can be reduced. Also, the hard mask pattern 108a is covered with the resist pattern 109 throughout the etching process. Because of this, it is possible to prevent the etching gas from causing the facet and the retrograde of the hard mask 108a.

Figure 1G:
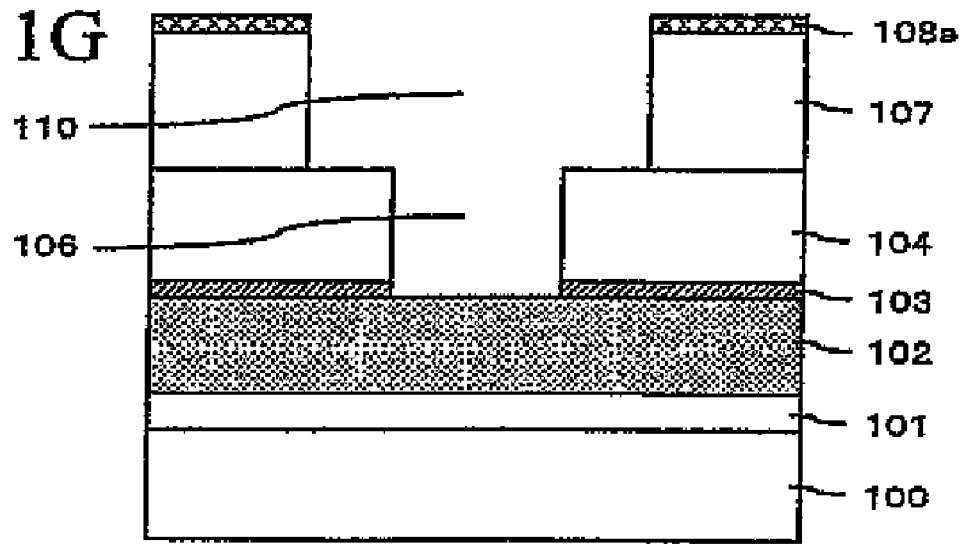

Next, as shown in FIG. 1G, a portion of the diffusion barrier film 103 made of a silicon nitride film, which is exposed at the bottom of the via hole 106, is eliminated: For example, in etching the diffusion barrier film 103, trifluoromethane ($CHF_3$), oxygen ($O_2$), and argon (Ar) are used as the etching gas. The etching conditions are set as follows. That is, the gas flow rate (sccm) of $CHF_3$, $O_2$, and Ar are set to be 30, 2, and 150 respectively, and the RF Power is set to be 800 W, and the chamber pressure is set to be 30 mTorr. In the process of etching the diffusion barrier film 103, the hard mask pattern 108a, which is made of a silicon dioxide film, is simultaneously etched to the designated thickness.

Figure 1H:
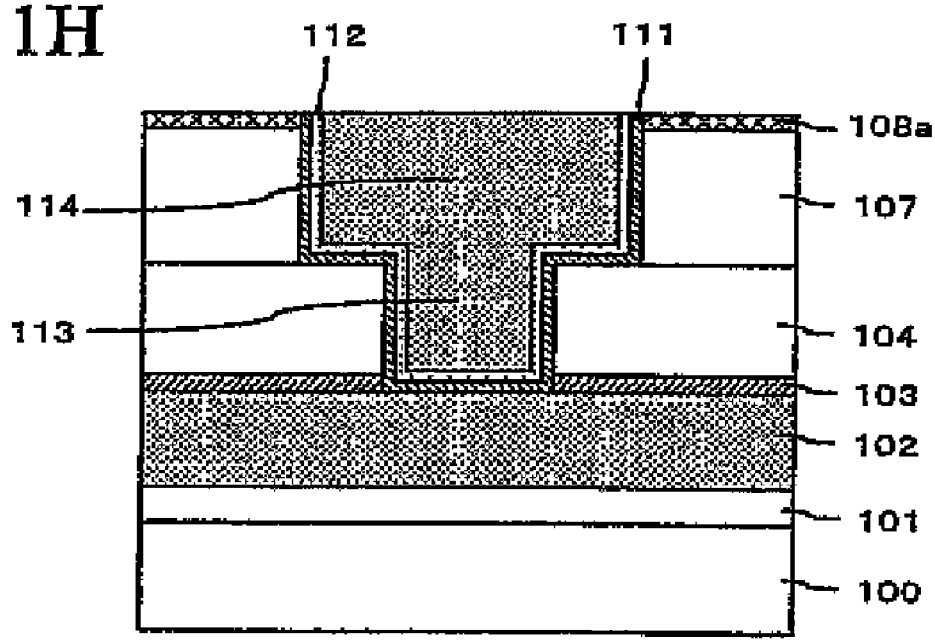

Next, as shown in FIG. 1H, a barrier layer 111, which blocks invasion of Cu, and a seed layer 112 are sequentially formed so that they can cover the inside surface of the via hole 106 and the wiring groove 110. The barrier layer 111 is a laminated layer that is made of tantalum (Ta) and tantalum nitride (TaN). The layers of the barrier layer 111 are sequentially comprised of a Ta layer, a TaN layer, and a Ta layer. The thickness (Å) of the Ta layer, the TaN layer, and the Ta layer are set to be 50, 400, 50, respectively. Also, the seed layer 112 is made of Cu and its thickness is set to be 1000 Å, for instance. Next, Cu is implanted into the via hole 106 and the wiring groove 110 with the electrolytic plating method, and the excess portion of the implanted Cu is eliminated with the CMP method. Thus, a via plug 113 and an upper layer wiring 114, which are made of Cu, are simultaneously formed.

In the first embodiment of the present invention, a method was described in which a dual damascene structure is formed between the first wiring layer (i.e., the lower layer wiring 102) on the semiconductor substrate (i.e., the semiconductor substrate 100) and the second wiring layer (i.e., the upper layer wiring 114). However, it is possible to form the dual damascene structure of the embodiment between other layers, and a desired multi-layer wiring structure can be formed by conducting the process described in FIGS. 1A through 1K repeatedly.

According to the method for manufacturing a semiconductor device of the first embodiment of the present invention, as shown in FIG. 1C, the via hole 106 is formed by etching the inorganic insulating film 104 that becomes the inter-via layer insulating film, before the organic insulating film 107 that becomes an inter-wiring layer insulating film is formed. Therefore, a hard mask is not required to conduct a patterning of the via hole 106, and the number of times the hard mask is exposed to the etching gas can be reduced. Because of this, the facet and the retrograde of the hard mask pattern 108a are inhibited, the wiring can be sized at the desired design value, and reliability and yield can be improved. Also, as shown in FIG. 1F, in the process of forming the wiring groove 110 and the via hole 106 by eliminating the organic insulating film 107 by etching, the hard mask pattern 108a is covered with the resist pattern 109 throughout the etching process. Therefore, the facet and the retrograde of the hard mask pattern by the etching gas can be inhibited. Also, the resist pattern 109 can be used for patterning the hard mask pattern 108a as shown in FIG. 1E, and also can be used as an etching protective film of the hard mask pattern 108a at the same time as shown in FIG. 1F. Because of this, it is not required to form a dummy film (e.g., a second hard mask pattern) to protect the hard mask pattern 108a, and the number of steps in the process of manufacturing a semiconductor device and the cost thereof can be reduced. Also, as shown in FIG. 1F, in the process of forming the wiring groove 110 and the via hole 106 by eliminating the organic insulating film 107 by etching, the resist pattern 109 can also be eliminated at the same time, because the resist pattern 109 is made of an organic substance, as with the organic insulating film 107 that is made of the SiLK™ film. Therefore, it is not required to conduct an ashing treatment to eliminate the resist pattern 109, and the number of steps in the process of manufacturing a semiconductor device and manufacturing cost thereof can be reduced.

Second Embodiment

Figure 2A:
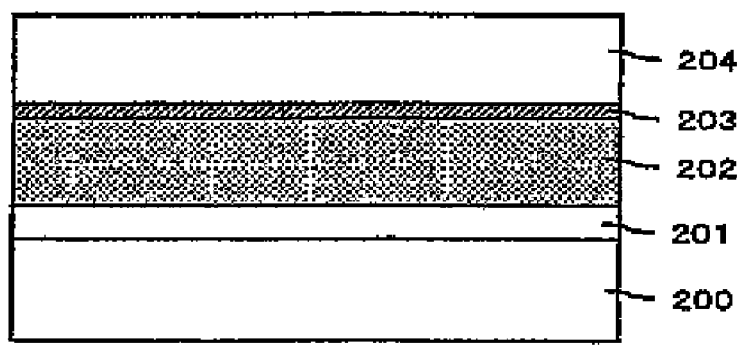
FIGS. 2A through 2H are views of diagrams showing a process of manufacturing a semiconductor device in accordance with a second embodiment of the present invention.

FIGS. 2A though 2H are cross-section diagrams to explain a method for manufacturing a semiconductor device with a dual damascene structure in accordance with the second embodiment of the present invention.

First, as shown in FIG. 2A, a semiconductor substrate 200 is prepared. The semiconductor substrate 200 has an electronic circuit (not shown in the diagram) formed by a semiconductor element such as a transistor on its main surface. Then, an insulating film 201 is formed on the semiconductor substrate 200, and a lower layer wiring 202, which is made of Cu, is formed on the insulating film 201. Next, a diffusion barrier film 203 is formed on the lower layer wring 202. For example, the diffusion barrier film 203 is made of a silicon nitride film and its thickness is set to be 500 Å. The diffusion barrier film 203 protects diffusion of Cu, which is the material of the lower layer wiring 202, and functions as an etching stopper layer with respect to the lower layer wiring 202. Also, the diffusion barrier film 203 is not necessarily required in the method of manufacturing a semiconductor device in accordance with the second embodiment of the present invention. For example, the diffusion barrier film 203 does not have to be formed, if the etch selectivity between the lower layer wiring 202 and an inorganic insulating film 204 (i.e., an object of an etching) can be set to be a larger value in the process of forming a via hole 206 by etching in the process shown below in FIG. 2C. Next, the inorganic insulating film 204 is formed. The inorganic insulating film 204 becomes an inter-via layer insulating film in which a via hole 206 is formed in a process shown below in FIG. 2C. For example, the inorganic insulating film 204 is made of methyl-silsequioxane (MSQ) film and its thickness is set to be 3000 Å. For example, a MSQ film can be formed with a method of spin-coating an MSQ substance and hardening it with a heat treatment in an inert gas atmosphere such as $N_2$. The MSQ film is a type of inorganic low-k film, and its relative dielectric constant (k) is low (k=2.7~2.9). Therefore, the inter-wiring capacitance can be reduced by using the MSQ film as the inorganic insulating film 204. Also, a hydrogen-silsequioxane (HSQ) film can be used as a substance of the inorganic insulating film 204, instead of using the MSQ film.

Figure 2B:
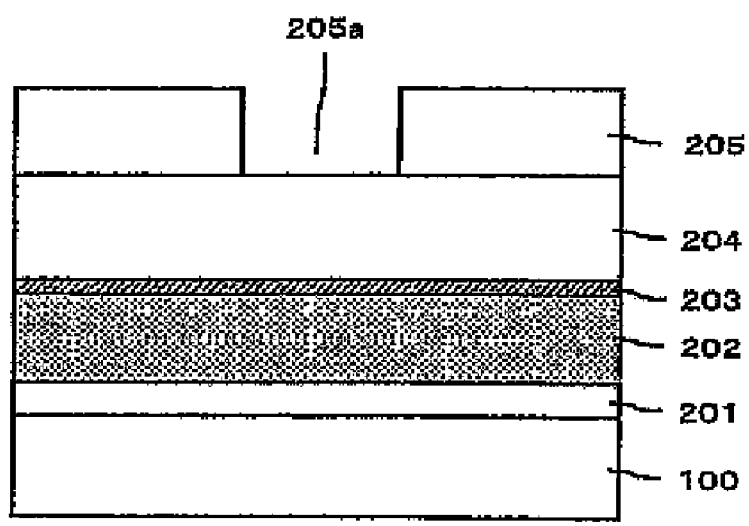

Next, as shown in FIG. 2B, a resist is applied on the inorganic insulating film 204 and a resist pattern 205 with an opening 205a is formed by photolithoetching the resist. For example, the diameter of the opening 205a is set to be 0.12 μm.

Figure 2C:
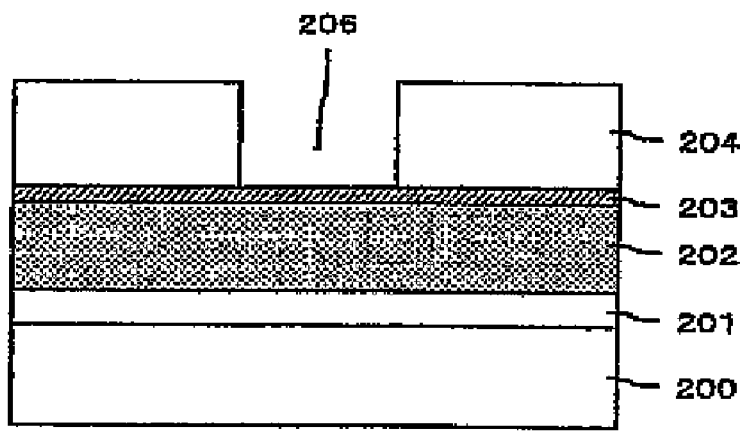

Next, as shown in FIG. 2C, a via hole 206 is formed by etching the inorganic insulating film 204 with the resist pattern 205 as an etching mask. The diameter of the via hole 206 is as large as that of the opening 205a, and it is set to be 0.12 μm, for instance. For example in etching the inorganic insulating film 204, octafluocyclobutane ($C_4F_8$), oxygen ($O_2$), and argon (Ar) are used as the etching gas. The etching conditions are set as follows. That is, the gas flow rate (sccm) of $C_4F_8$, $O_2$, and Ar are set to be 20, 10, and 500 respectively, and the RF Power is set to be 1.5 kW, and the chamber pressure is set to be 40 mTorr. Next, the resist pattern 205 is eliminated with ashing.

Figure 2D:
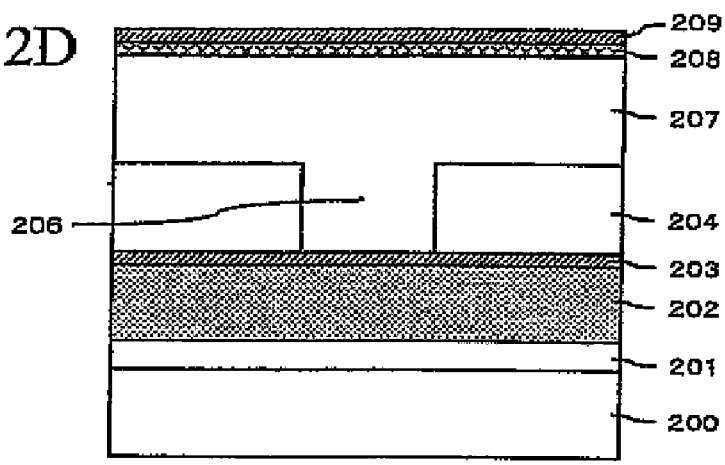

Next, as shown in FIG. 2D, an organic insulating film 207 is formed so that it covers the inorganic insulating film 204 and the inside of the via hole 206. The organic insulating film 207 becomes an inter-wiring layer insulating film in which a wiring groove 211 is formed in a process shown below in FIG. 2F. For example, the organic insulating film 207 is made of silicon low-k polymer (SiLK™ of Dow Chemical Company), and its thickness is set to be 3000 Å. The silicon low-k polymer film can be formed by spin-coating the silicon low-k polymer substance and hardening it with a heat treatment in an inert gas atmosphere, such as $N_2$, for instance. The silicon low-k polymer film is a type of organic low-k film, and its relative dielectric constant is low (k=2.6~28). Therefore, the inter-wiring capacitance can be reduced by using the silicon low-k polymer as the organic insulating film 207. Also, GX-3™ of Honeywell International Inc. can be used as the material of the organic insulating film 207, instead of using the SiLK™. Next, a silicon dioxide film that becomes a hard mask 208 and a silicon nitride film that becomes an upper layer hard mask 209 are sequentially formed with the chemical vapor deposition (CVD) method. For example, the thickness of the silicon dioxide film that becomes a lower layer hard mask 208 is set to be 500 Å. Also, the thickness of the silicon nitride film that becomes an upper layer hard mask 209 is set to be the same value with that of the diffusion barrier film 203. For example, the thickness is set to be 500 Å.

Figure 2E:
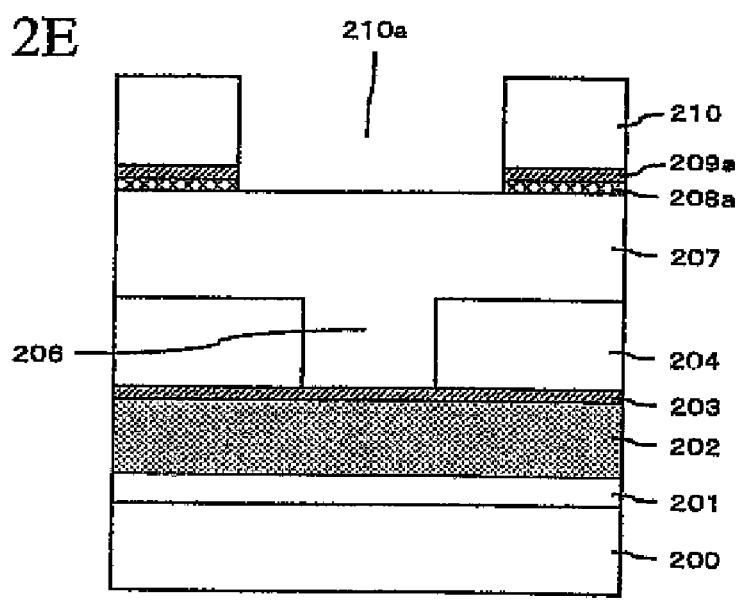

Next, a resist is applied on the upper layer hard mask 209, and a resist pattern 210 with an opening 210a is formed with photolithoetching, as shown in FIG. 2E. Next, an upper layer hard mask pattern 209a and a lower layer hard mask pattern 208a are formed by etching a silicon dioxide film (i.e., the upper layer hard mask 209) and a silicon dioxide film (i.e., the lower layer hard mask 208) sequentially with the resist pattern 210 as an etching mask. For example, in etching the upper layer hard mask 209, trifluoromethane ($CHF_3$), oxygen ($O_2$), and argon (Ar) are used as the etching gas. The etching conditions are set as follows. That is, the gas flow rate (sccm) of $CHF_3$, $O_2$, and Ar are set to be 30, 2, and 150 respectively, and the RF Power is set to be 800 W, and the chamber pressure is set to be 30 mTorr. Also, in etching the lower layer hard mask 208, octafluocyclobutane ($C_4F_8$), oxygen ($O_2$), and argon (Ar) are used as the etching gas. The etching conditions are set as follows. That is, the gas flow, rate (sccm) of $C_4F_8$, $O_2$, and Ar are set to be 20, 10, and 500 respectively, and the RF Power is set to be 1.5 kW, and the chamber pressure is set to be 40 mTorr.

Figure 2F:
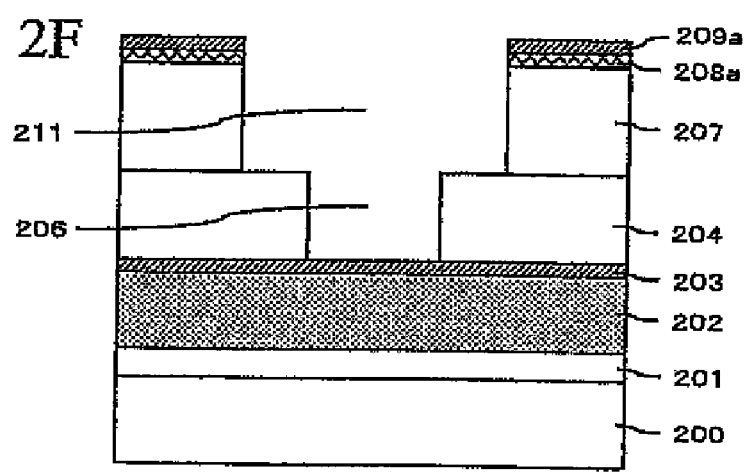

Next, as shown in FIG. 2F, a wiring groove 211 is formed by etching the organic insulating film 207 with the resist pattern 210, the upper layer hard mask pattern 209a, and the lower layer hard mask pattern 208a as etching masks. Also, a via hole 206 is exposed by eliminating the organic insulating film 207 that is implanted in the via hole 206. For example, in etching the organic insulating film 207, ammonia ($NH_3$) is used as the etching gas. The etching condition is set as follows. That is, the gas flow rate of $NH_3$ is set to be 100 sccm, and the RF Power is set to be 500 W, and the chamber pressure is set to be 60 mTorr. Also, in this etching process, the resist pattern 210 can also be eliminated simultaneously. This is because the resist pattern 210 and the organic insulating film 207 (the SiLK™ film) are made of an organic substance. Because of this, an ashing treatment to eliminate the resist pattern 210 is not required, and the number of processes required for the method for manufacturing a semiconductor device can be reduced. Also, the upper layer hard mask pattern 209a and the lower layer hard mask pattern 208a are covered with the resist pattern 210 throughout the etching process. Because of this, it is possible to prevent the etching gas from causing the facet and the retrograde of the upper layer hard mask pattern 209a that is made of a silicon nitride film.

Figure 2G:
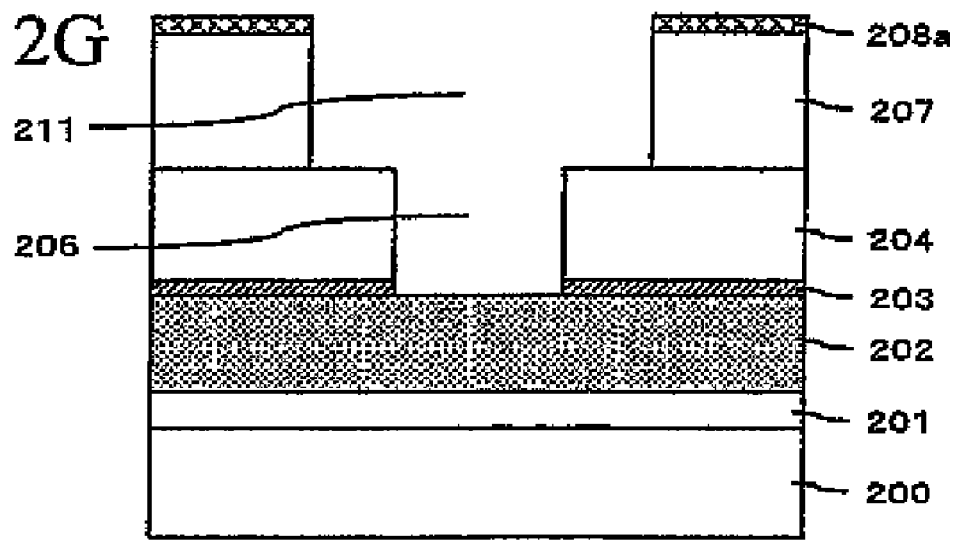

Next, as shown in FIG. 2G, the upper layer hard mask pattern 209a made of a silicon nitride film is eliminated by etching, and a portion of the diffusion barrier film 203 made of a silicon nitride film, which is exposed at the bottom of the via hole 206, is simultaneously eliminated in this etching. For example, in etching the diffusion barrier film 203, trifluoromethane ($CHF_3$), oxygen ($O_2$), and argon (Ar) are used as the etching gas. The etching conditions are set as follows. That is, the gas flow rate (sccm) of $CHF_3$, $O_2$ and Ar are set to be 30, 2, and 150 respectively, and the RF Power is set to be 800 W, and the chamber pressure is set to be 30 mTorr.

Figure 2H:
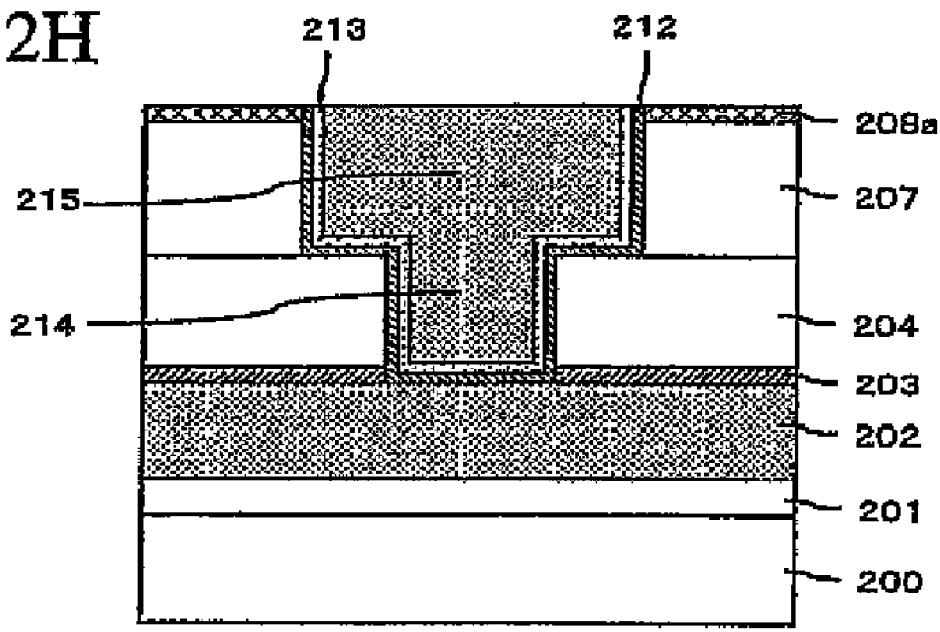

Next, as shown in FIG. 2H, a barrier layer 212, which blocks invasion of Cu, and a seed layer 213 are sequentially formed so that they can cover the inside surface of the via hole 206 and the wiring groove 211. The barrier layer 212 is a laminated layer that is made of tantalum (Ta) and tantalum nitride (TaN). The layers of the barrier layer 212 are sequentially comprised of a Ta layer, a TaN layer, and a Ta layer. The thickness (Å) of the Ta layer, the TaN layer, and the Ta layer are set to be 50, 400, 50, respectively. Also, the seed layer 213 is made of Cu and its thickness is set to be 1000 Å, for instance. Next, Cu is implanted into the via hole 206 and the wiring groove 211 with the electrolytic plating method, and the excess portion of the implanted Cu is eliminated with the CMP method. Thus, a via plug 214 and an upper layer wiring 215, which are made of Cu, are simultaneously formed.

In the second embodiment of the present invention, a method is described in which a dual damascene structure is formed between the first wiring layer (i.e., the lower layer wiring 202) on the semiconductor substrate (i.e., the semiconductor substrate 200) and the second wiring layer (i.e. the upper layer wiring 215). However, it is possible to form the dual damascene structure of the embodiment between other layers, and a desired multi-layer wiring structure can be formed by conducting the process described in FIGS. 2A through 2H repeatedly.

The method for manufacturing a semiconductor device of the second embodiment of the present invention has the same effects of the first embodiment of the present invention. That is, as shown in FIG. 2C, the via hole 206 is formed by etching the inorganic insulating film 204 that becomes the inter-via layer insulating film, before the organic insulating film 207 that becomes an inter-wiring layer insulating film is formed. Therefore, a hard mask is not required to conduct a patterning of the via hole 206, and the number of times the hard mask is exposed to the etching gas can be reduced. Because of this, the facet and the retrograde of a hard mask, especially of the hard mask pattern 209a that is made of a silicon nitride film, are inhibited, the wiring can be sized at the desired design value and reliability and yield can be improved. Also, as shown in FIG. 2F, in the process of forming the wiring groove 211 and the via hole 206 by eliminating the organic insulating film 207 with etching the upper layer hard mask pattern 209a and the lower layer hard mask pattern 208a are covered with the resist pattern 210 throughout the etching process. Therefore, the facet and the retrograde of the hard mask pattern by the etching gas can be inhibited. Also, the resist pattern 210 can be used for patterning the upper layer hard mask pattern 209a and the lower layer hard mask pattern 208a as shown in FIG. 2E, and also can be used as an etching protective film of the upper layer hard mask pattern 209a and the lower layer hard mask pattern 208a at the same time as shown in FIG. 2F. Because of this, it is not required to form a dummy film (e.g., a third hard mask pattern) to protect the upper layer hard mask pattern 209a and the lower layer hard mask pattern 208a, and the number of steps in the process of manufacturing a semiconductor device and the cost thereof can be reduced. Also, as shown in FIG. 2F, in the process of forming the wiring groove 211 and the via hole 206 by eliminating the organic insulating film 207 with etching, the resist pattern 210 can also be eliminated at the same time, because the resist pattern 210 is made of an organic substance, as with the organic insulating film 207 that is made of the SiLK™ film. Therefore, it is not required to conduct an ashing treatment to eliminate the resist pattern 210, and the number of steps in the process of manufacturing a semiconductor device and the manufacturing cost thereof can be reduced.

Third Embodiment

Figure 3A:
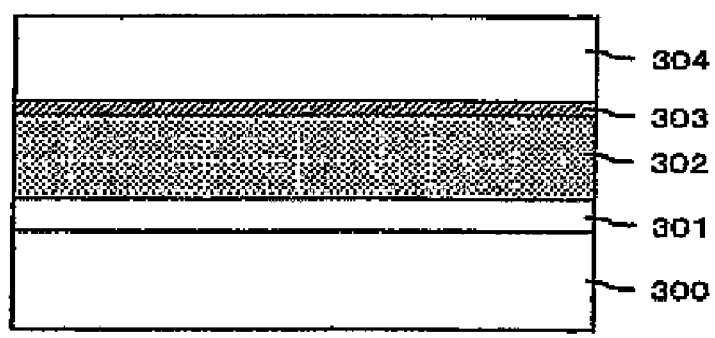
FIGS. 3A through 3I are views of diagrams showing a process of manufacturing a semiconductor device in accordance with a third embodiment of the present invention.

FIGS. 3A though 3H are cross-section diagrams to explain a method for manufacturing a semiconductor device with a dual damascene structure in accordance with the third embodiment of the present invention.

First, as shown in FIG. 3A, a semiconductor substrate 300 is prepared. The semiconductor substrate 300 has an electronic circuit (not shown in the diagram) formed by a semiconductor element such as a transistor on its main surface. Then, an insulating film 301 is formed on the semiconductor substrate 300, and a lower layer wiring 302, which is made of Cu, is formed on the insulating film 301. Next, a diffusion barrier film 303 is formed on the lower layer wiring 302. For example, the diffusion barrier film 303 is made of a silicon nitride film and its thickness is set to be 500 Å. The diffusion barrier film 303 protects diffusion of Cu, which is the material of the lower layer wiring 302, and functions as an etching stopper layer with respect to the lower layer wiring 302. Also, the diffusion barrier film 303 is not necessarily required in the method of manufacturing a semiconductor device in accordance with the third embodiment of the present invention. For example, the diffusion barrier film 303 does not have to be formed, if the etch selectivity between the lower layer wiring 302 and an organic insulating film 304 (i.e., an object of an etching) can be set to be a larger value in the process of forming a via hole 306 by etching in the process shown below in FIG. 3C. Next, the organic insulating film 304 is formed. The organic insulating film 304 becomes an inter-via layer insulating film in which a via hole 306 is formed in a process shown below in FIG. 3C. For example, the organic insulating film 304 is made of a SiLK™ film and its thickness is set to be 3000 Å. For example, a SiLK™ film can be formed with a method of spin-coating a SiLK™ substance and hardening it with a heat treatment in an inert gas atmosphere such as $N_2$. The SiLK™ film is a type of organic low-k film, and its relative dielectric constant (k) is low (k=2.6~28). Therefore, the inter-wiring capacitance can be reduced by using the SiLK™ film as the organic insulating film 304. Also, a GX-3™ film can be used as the material of the organic insulating film 304, instead of the SiLK™ film.

Figure 3B:
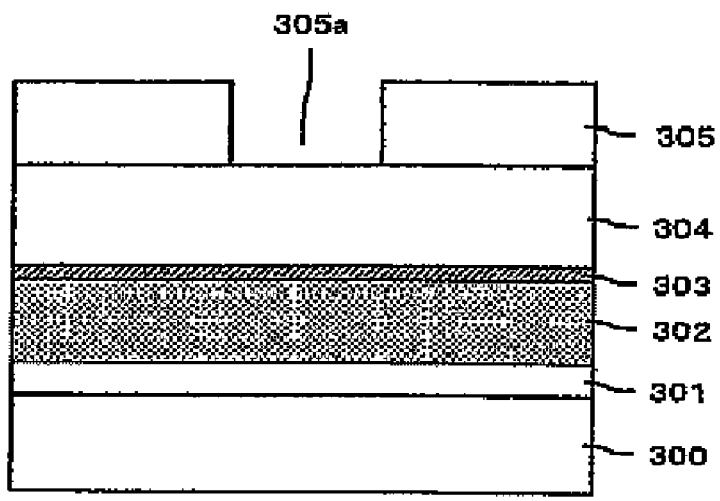

Next, as shown in FIG. 3B, a resist is applied on the organic insulating film 304 and a resist pattern 305 with an opening 305a is formed by photolithoetching the resist. For example, the diameter of the opening 305a is set to be 0.12 μm.

Figure 3C:
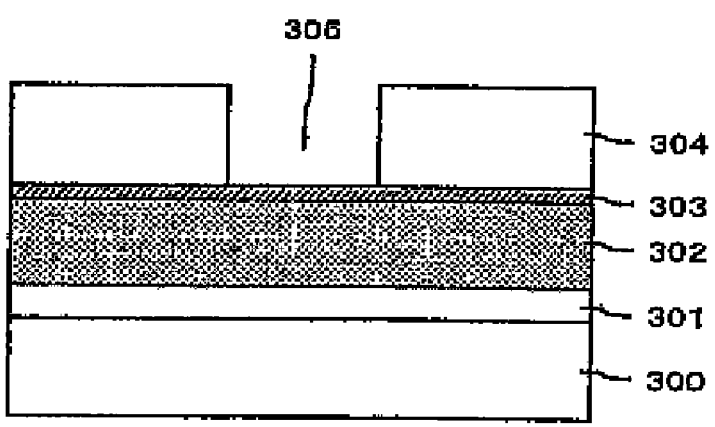

Next, as shown in FIG. 3C, a via hole 306 is formed by etching the organic insulating film 304 with the resist pattern 305 as an etching mask. The diameter of the via hole 306 is as large as that of the opening 305a, and it is set to be 0.12 μm, for instance. For example, in etching the organic insulating film 304, ammonia ($NH_3$) is used as the etching gas. The etching conditions are set as follows. That is, the gas flow rate of $NH_3$ is set to be 100 sccm, and the RF Power is set to be 500 W, and the chamber pressure is set to be 60 mTorr. In this etching process, the resist pattern 305 can also be eliminated, because the resist pattern 305 is made of an organic substance as with the SiLK™ film that comprises the organic insulating film 304. Because of this, an ashing treatment is not required to eliminate the resist pattern 305 and the number of manufacturing processes of a semiconductor device can be reduced.

Figure 3D:
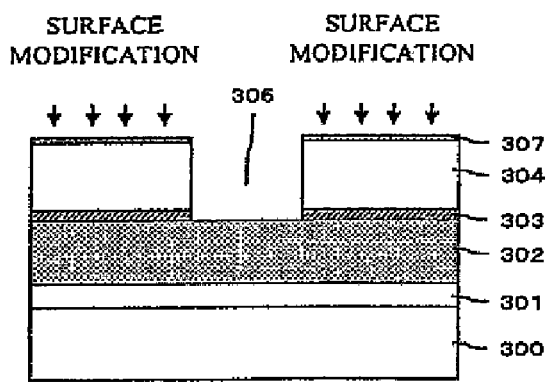

As shown in FIG. 3D, a portion of the diffusion barrier film 303 made of a silicon nitride film, which is exposed at the bottom of the via hole, is eliminated. For example, in etching the diffusion barrier film 303, trifluoromethane ($CHF_3$), oxygen ($O_2$), and argon (Ar) are used as the etching gas. The etching conditions are set as follows. That is, the gas flow rate (sccm) of $CHF_3$, $O_2$, and Ar are set to be 30, 2, and 150 respectively, and the RF Power is set to be 800 W, and the chamber pressure is set to be 30 mTorr. Also, in this etching process, a surface modification layer 307 is formed by modifying the surface of the organic insulating film 304 that is made of the organic SiLK™ film with a plasma treatment. The surface modification layer 307 has the effect of enhancing its adhesiveness with an inorganic insulating film 308 formed in a process shown below in FIG. 3E.

Figure 3E:
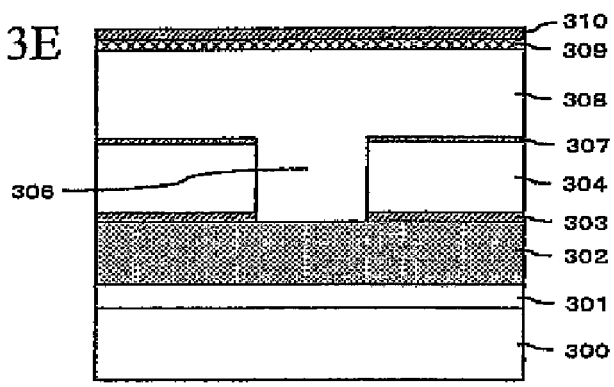

Next, as shown in FIG. 3E, the inorganic insulating film 308 is formed so that it covers the organic insulating film 304 and the inside of the via hole 306. The inorganic insulating film 308 becomes an inter-wiring layer insulating film in which a wiring groove 312 is formed in a process shown below in FIG. 3H. For example, the inorganic insulating film 308 is made of a methyl-silsequioxane (MSQ) film and its thickness is set to be 3000 Å. For example, a MSQ film can be formed with a method of spin-coating a MSQ substance and hardening it with a heat treatment in an inert gas atmosphere such as N2. The MSQ film is a type of inorganic low-k film, and its relative dielectric constant (k) is low (k=2.7~2.9). Therefore, the inter-wiring capacitance can be reduced by using the MSQ film as the inorganic insulating film 308. Also, a hydrogen-silsequioxane (HSQ) film can be used as the material of the inorganic insulating film 308, instead of the MSQ film. Next, a silicon dioxide film that becomes a lower layer hard mask 309 and a silicon nitride film that becomes an upper layer hard mask 310 are sequentially formed. For example, the thickness of the silicon dioxide film that becomes the lower layer hard mask 309 is set to be 500 Å. Also, the thickness of the silicon nitride film that becomes the upper layer hard mask 310 is set to be that of the diffusion barrier film 303, for example, 500 Å.

Figure 3F:
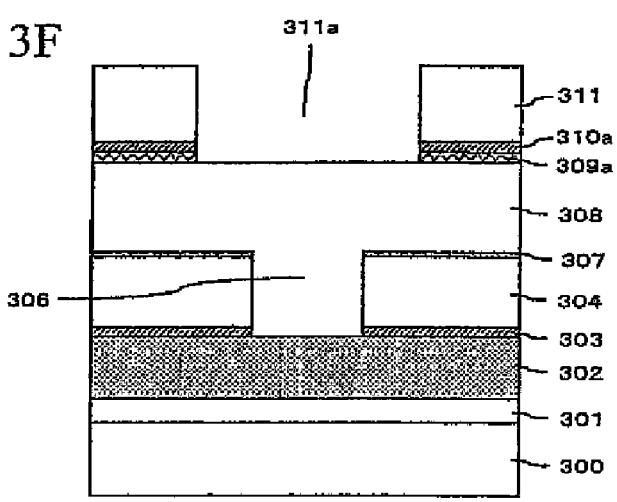

Next, a resist is applied on the upper layer hard mask 310, and a resist pattern 311 with an opening 311a is formed with photolithoetching, as shown in FIG. 3F. Next, an upper layer hard mask pattern 310a and a lower layer hard mask pattern 309a are formed by etching a silicon nitride film (i.e., the upper layer hard mask 310) and a silicon dioxide film (i.e., the lower layer hard mask 309) with the resist pattern 311 as an etching mask. For example, in etching the upper layer hard mask 310, trifluoromethane ($CHF_3$), oxygen ($O_2$), and argon (Ar) are used as the etching gas. The etching conditions are set as follows. That is, the gas flow rate (sccm) of $CHF_3$, $O_2$ and Ar are set to be 30, 2, and 150 respectively, and the RF Power is set to be 800 W, and the chamber pressure is set to be 30 mTorr. For example, in etching the lower layer hard mask 309, octafluorocyclobutane ($C_4F_8$), oxygen ($O_2$), and argon (Ar) are used as the etching gas. The etching conditions are set as follows. That is, the gas flow rate (sccm) of $C_4F_8$, $O_2$, and Ar are set to be 20, 10, and 500 respectively, and the RF Power is set to be 1.5 kW, and the chamber pressure is set to be 40 mTorr.

Figure 3G:
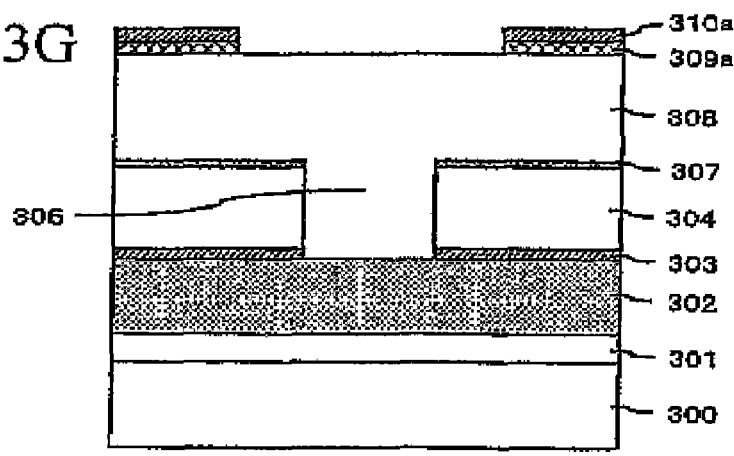

Next, as shown in FIG. 3G, the resist pattern 311 is eliminated with an ashing treatment. In a process shown below in FIG. 3H, if an ashing treatment is conducted for the resist pattern 311 after the formation of the inorganic insulating film 308 made of the MSQ film, there is a possibility that the lower layer wiring 302, which is made of Cu and exposed at the bottom of the via hole 306, will be damaged. Therefore, damage of the lower layer wiring by this ashing treatment is prevented by eliminating the resist pattern 311.

Figure 3H:
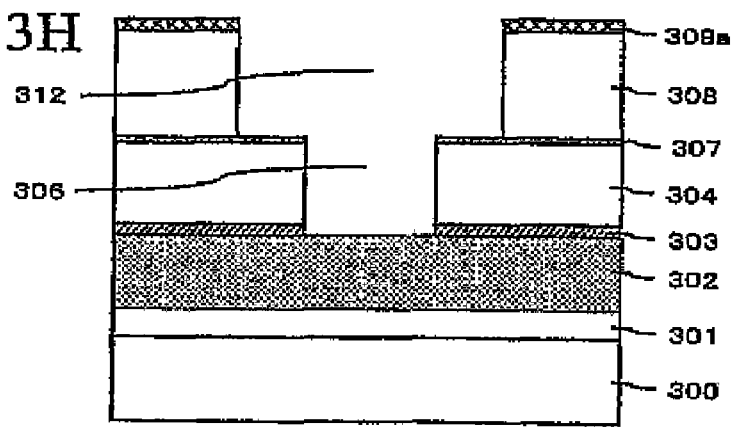

Next, as shown in FIG. 3H, a wiring groove 312 is formed by etching the inorganic insulating film 308 with the upper layer hard mask pattern 310a and the lower layer hard mask pattern 309a as etching masks. Also, a via hole 306 is exposed by eliminating the inorganic insulating film 308 that is implanted in the via hole 306. For example, in etching the inorganic insulating film 308, octafluorocyclobutane ($C_4F_8$), oxygen ($O_2$), and argon (Ar) are used as the etching gas. The etching conditions are set as follows. That is, the gas flow rate (sccm) of $C_4F_8$, $O_2$, and Ar are set to be 20, 10, and 500 respectively, and the RF Power is set to be 1.5 kW, and the chamber pressure is set to be 40 mTorr. Also, in this etching process, the upper layer hard mask pattern 310a made of a silicon nitride film can also be eliminated simultaneously. Also, in this etching process, the value of the etch selectivity between the inorganic insulating film 308 made of the MSQ film and the organic insulating film 304 made of the SiLK™ film is more than 50. Therefore, only the inorganic insulating film 308 made of the MSQ film can be effectively eliminated.

Figure 3I:
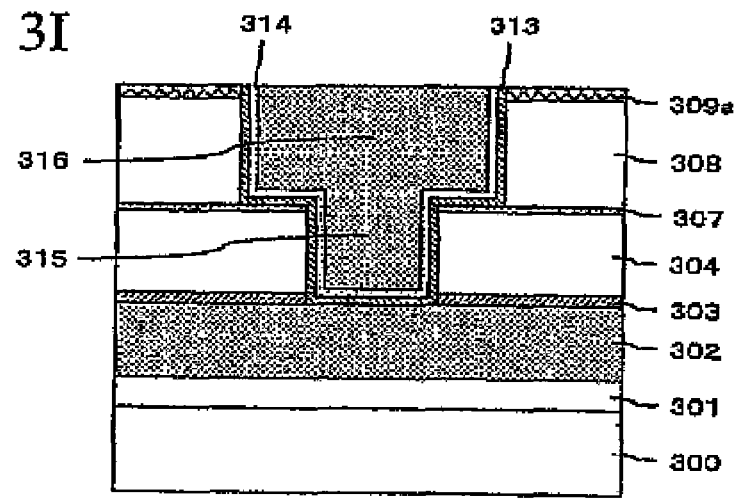

Next, as shown in FIG. 3I, a barrier layer 313, which blocks invasion of Cu, and a seed layer 314 are sequentially formed, so that they can cover the inside surface of the via hole 306 and the wiring groove 312. The barrier layer 313 is a laminated layer that is made of tantalum (Ta) and tantalum nitride (TaN). The layers of the barrier layer 313 are sequentially comprised of a Ta layer, a TaN layer, and a Ta layer. The thickness (A) of the Ta layer, the TaN layer, and the Ta layer are set to be 50, 400, 50, respectively. Also, the seed layer 314 is made of Cu and its thickness is set to be 1000 Å, for instance. Next, Cu is implanted into the via hole 306 and the wiring groove 312 with the electrolytic plating method, and the excess portion of the implanted Cu is eliminated with the CMP method. Thus, a via plug 315 and an upper layer wiring 316, which are made of Cu, are simultaneously formed.

In the third embodiment of the present invention, a method is described in which a dual damascene structure is formed between the first wiring layer (i.e., the lower layer wiring 302) on the semiconductor substrate (i.e., the semiconductor substrate 300) and the second wiring layer (i.e., the upper layer wiring 316). However, it is possible to form the dual damascene structures of the embodiment between other layers, and a desired multi-layer wiring structure can be formed by conducting the process described in FIGS. 3A through 3I repeatedly.

According to the method for manufacturing a semiconductor device of the third embodiment of the present invention, as shown in FIG. 3C, the via hole 306 is formed by etching the organic insulating film 304 that becomes an inter-via layer insulating film, before the inorganic insulating film 308 that becomes an inter-wiring layer insulating film is formed. Therefore, a hard mask is not required to conduct a patterning of the via hole 306, and the number of times the hard mask is exposed to the etching gas can be reduced. Because of this, the facet and the retrograde of the upper layer hard mask pattern 310a made of a silicon nitride film are inhibited, the wiring size can be formed at the desired design value, and reliability and yield can be improved. Also, in a process of eliminating the diffusion barrier film 303 that is exposed at the bottom of the via hole 306 shown in FIG. 3D, the surface modification layer 307 is formed by modifying the surface of the organic insulating film 304 made of the organic film with a plasma treatment. Therefore, its adhesiveness with an inorganic insulating film 308 formed on the organic insulating film can be enhanced, and reliability and yield can be improved. Also, as shown in FIG. 3C, in the process of forming the via hole 306 by eliminating the organic insulating film 304 by etching, the resist pattern 305 can also be eliminated at the same time, because the resist pattern 305 is made of an organic substance, as with the organic insulating film 304 that is made of the SiLK™ film. Therefore, it is not required to conduct an ashing treatment to eliminate the resist pattern 305, and the number of steps in the process of manufacturing a semiconductor device and the manufacturing cost thereof can be reduced.

This application claims priority to Japanese Patent Application No. 2004-368064. The entire disclosure of Japanese Patent Application No. 2004-368064 is hereby incorporated herein by reference.

The terms of degree such as "nearly" used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a semiconductor device with a dual damascene structure, comprising:
    preparing a semiconductor substrate;
    forming a first interconnection layer over the semiconductor substrate;
    forming an organic insulating film over the first interconnection layer;
    forming a via hole in the organic insulating film;
    forming an inorganic insulating film so that the inorganic insulating film covers an upper surface of the organic insulating film and an interior of the via hole;
    forming a hard mask pattern on the inorganic insulating film;
    forming an interconnection groove by etching the inorganic insulating film with the hard mask pattern as an etching mask until the inorganic insulating film inside said via hole is removed;
    filling the via hole and the interconnection groove with a conductive substance,
    wherein forming said hard mask pattern on said inorganic insulating film includes forming a hard mask on said inorganic insulating film, forming a second resist pattern with an opening on the hard mask, and etching the hard mask with the second resist pattern as an etching mask; and
    removing the second resist pattern, before said forming an interconnection groove.

2. The method according to claim 1, wherein forming said via hole in said organic insulating film includes forming a first resist pattern with an opening on the organic insulating film, and etching the organic insulating film with the first resist pattern as an etching mask and simultaneously removing the first resist pattern.

3. The method according to claim 1, further comprising:
    forming a diffusion barrier film on said first interconnection layer after forming the first interconnection layer over said semiconductor substrate, said organic insulating film being formed on the diffusion barrier film; and
    removing the diffusion barrier film that is located inside said via hole, before said forming an inorganic insulating film.

4. The method according to claim 1, wherein said organic insulating film is a silicon low-k polymer film.

5. The method according to claim 1, wherein said inorganic insulating film is a methyl-silsequioxane (MSQ) film.

6. The method according to claim 1, wherein said organic insulating film is a silicon low-k polymer film and said inorganic insulating film is methyl-silsequioxane (MSQ) film.

7. The method according to claim 3, wherein said diffusion barrier film is a silicon nitride film.

8. A method for manufacturing a semiconductor device with a dual damascene structure, comprising:
    preparing a semiconductor substrate;
    forming a first interconnection layer over the semiconductor substrate;
    forming an organic insulating film over the first interconnection layer;
    forming a via hole in the organic insulating film;
    forming an inorganic insulating film so that the inorganic insulating film covers an upper surface of the organic insulating film and an interior of the via hole;
    forming a hard mask pattern on the inorganic insulating film;
    forming an interconnection groove by etching the inorganic insulating film with the hard mask pattern as an etching mask until the inorganic insulating film inside said via hole is removed;
    filling the via hole and the interconnection groove with a conductive substance;
    forming a diffusion barrier film on said first interconnection layer after forming the first interconnection layer over said semiconductor substrate, said organic insulating film being formed on the diffusion barrier film; and
    removing the diffusion barrier film that is located inside said via hole, before said forming an inorganic insulating film,
    wherein a modified layer is formed by conducting a plasma treatment of a surface of said organic insulating film simultaneously with the removal of said diffusion barrier film.

9. A method for manufacturing a semiconductor device with a dual damascene structure, comprising:
    preparing a semiconductor substrate;
    forming a first interconnection layer over the semiconductor substrate;
    forming an organic insulating film over the first interconnection layer;
    forming a via hole in the organic insulating film;
    forming an inorganic insulating film so that the inorganic insulating film covers an upper surface of the organic insulating film and an interior of the via hole;
    forming a hard mask pattern on the inorganic insulating film;
    forming an interconnection groove by etching the inorganic insulating film with the hard mask pattern as an etching mask until the inorganic insulating film inside said via hole is removed; and
    filling the via hole and the interconnection groove with a conductive substance,
    wherein said hard mask pattern is comprised of a first hard mask pattern and a second hard mask pattern; and
    wherein said forming an interconnection groove includes simultaneously removing said second hard mask pattern from the first hard mask pattern outside the interconnection groove.

10. The method according to claim 9, wherein said first hard mask pattern is a silicon dioxide film, and said second hard mask pattern is a silicon nitride film.

* * * * *